(12) United States Patent
Campbell et al.

(10) Patent No.: US 8,987,583 B2
(45) Date of Patent: Mar. 24, 2015

(54) VARIABLE OPTICAL DENSITY SOLAR COLLECTOR

(71) Applicants: Ann B Campbell, Los Gatos, CA (US);
Joel F Farber, San Jose, CA (US);
Harry R Campbell, Los Gatos, CA (US)

(72) Inventors: Ann B Campbell, Los Gatos, CA (US);
Joel F Farber, San Jose, CA (US);
Harry R Campbell, Los Gatos, CA (US); James P Campbell, Atherton, CA (US)

( * ) Notice: Subject to any disclaimer, the term of this patent is extended or adjusted under 35 U.S.C. 154(b) by 0 days.

(21) Appl. No.: 13/691,779

(22) Filed: Dec. 1, 2012

(65) Prior Publication Data

US 2014/0190552 A1  Jul. 10, 2014

(51) Int. Cl.
*H01L 31/042* (2014.01)
*H01L 31/00* (2006.01)
*H01L 31/18* (2006.01)
*H01L 31/054* (2014.01)

(52) U.S. Cl.
CPC ............ *H01L 31/18* (2013.01); *H01L 31/0543* (2014.12)
USPC ........................................ 136/246; 136/259

(58) Field of Classification Search
CPC .............. H01L 31/052; H01L 31/0522; H01L 31/0524; H01L 31/0525
USPC ........................................................ 136/246
See application file for complete search history.

(56) References Cited

U.S. PATENT DOCUMENTS

| | | |
|---|---|---|
| 4,824,489 A | 4/1989 | Cogan et al. |
| 5,192,991 A | 3/1993 | Hosokawa |
| 5,413,959 A | 5/1995 | Yamamoto et al. |
| 5,578,502 A | 11/1996 | Albright et al. |
| 5,667,597 A | 9/1997 | Ishihara |
| 5,677,240 A | 10/1997 | Murakami et al. |
| 5,714,404 A | 2/1998 | Mitlitsky et al. |
| 5,886,688 A | 3/1999 | Fifield et al. |
| 6,111,191 A | 8/2000 | Hall et al. |
| 6,180,871 B1 | 1/2001 | Campbell et al. |
| 6,211,455 B1 | 4/2001 | Ford et al. |
| 6,320,117 B1 | 11/2001 | Campbell et al. |
| 6,420,643 B2 | 7/2002 | Ford et al. |
| 6,509,204 B2 | 1/2003 | Campbell |
| 7,091,411 B2 | 8/2006 | Falk et al. |
| 7,498,058 B2 | 3/2009 | Harris et al. |
| 7,592,198 B2 | 9/2009 | Huet et al. |
| 8,148,192 B2 | 4/2012 | Campbell et al. |
| 8,168,467 B2 | 5/2012 | Campbell et al. |
| 8,174,776 B2 | 5/2012 | Campbell et al. |
| 8,273,595 B2 | 9/2012 | Cording et al. |
| 2001/0008144 A1* | 7/2001 | Uematsu et al. ............... 136/246 |
| 2003/0005954 A1* | 1/2003 | Emoto et al. .................. 136/244 |

OTHER PUBLICATIONS

Merriam-Webster, Definition of "Through", http://www.merriam-webster.com/dictionary/through.*

* cited by examiner

*Primary Examiner* — James Lin
*Assistant Examiner* — Dujuan Horton

(57) ABSTRACT

The invention described here is a variable optical density solar collector optimized to be used in a nominally vertical orientation and in synergy with an adjacent, complementary solar concentrator.

4 Claims, 4 Drawing Sheets

A SINGLE ELEMENT CRESCENT SHAPED SOLAR COLLECTOR AND CONNECTIONS

A PROCESS FOR FABRICATING A TRANSPARENT SOLAR COLLECTOR

FIG. 3
SAMPLE ARRAY VARIATIONS
FIG. 3A
A DENSE ARRAY
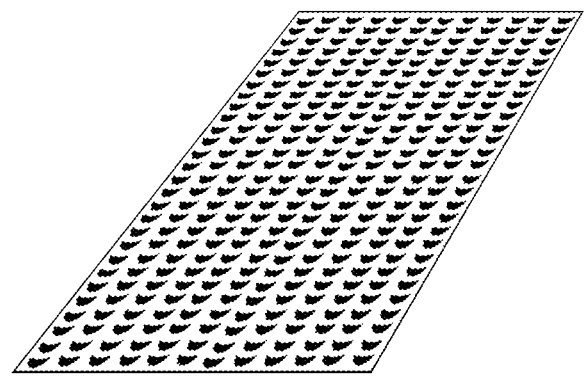
FIG 3B
A CUSTOM ARRAY
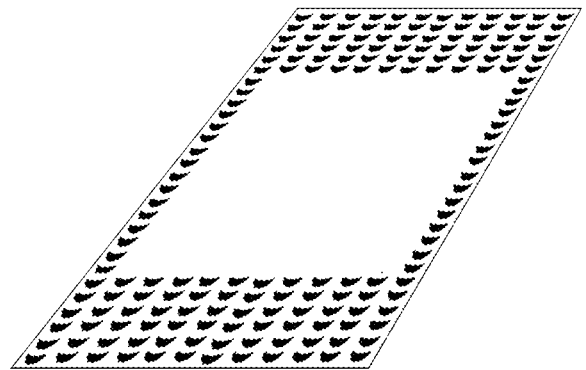
FIG. 3C
A SPARSE ARRAY
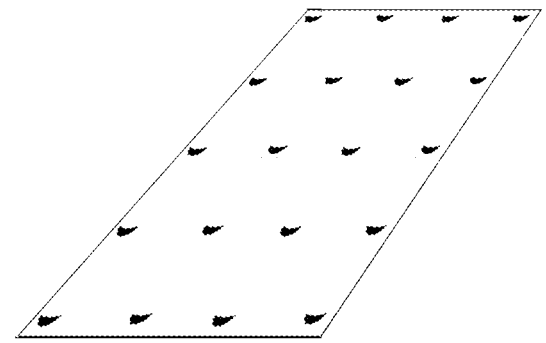

FIG. 4
SINGLE SOLAR COLLECTOR ELEMENT AND CONCENTRATOR
FIG. 4A
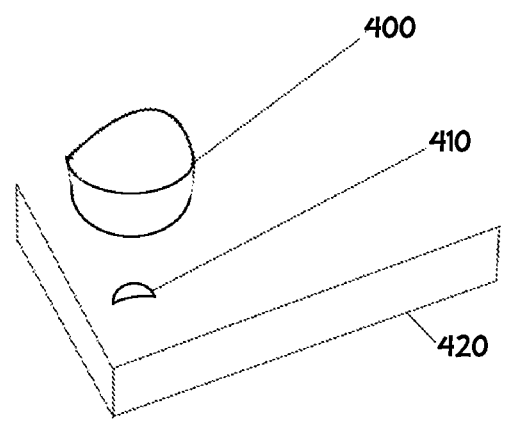
FIG. 4B
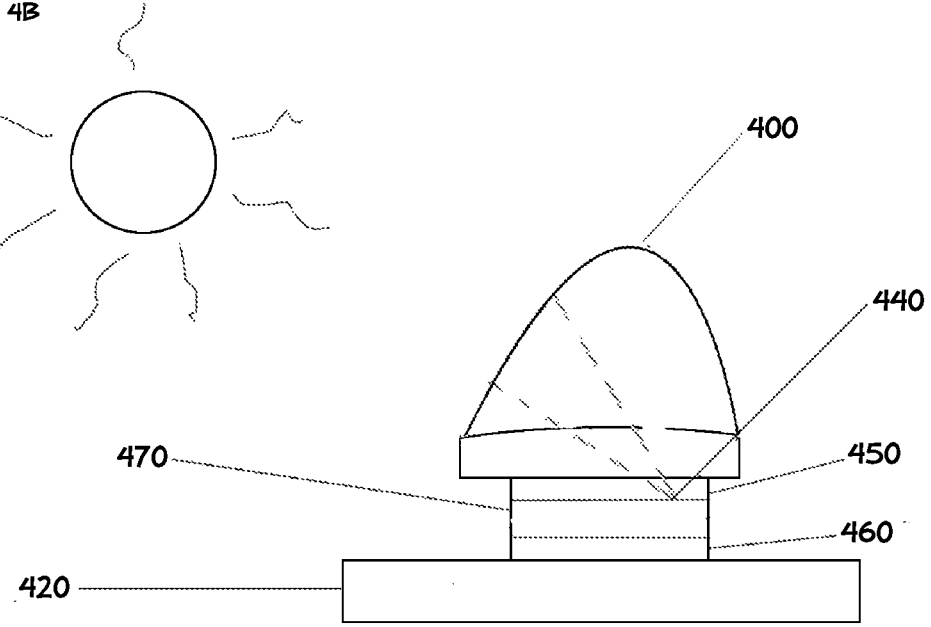

VARIABLE OPTICAL DENSITY SOLAR COLLECTOR

FIELD OF THE INVENTION

The present invention relates to solar energy collectors optimized for vertical placement.

DESCRIPTION

The invention described here, a "variable optical density solar collector", is optimized to be used while in a nominally vertical orientation and in synergy with an adjacent, complementary, solar concentrator. This system is configured to concentrate solar energy on a solar collector to maximize the delivery of solar electric power. In its usual embodiment it is positioned vertically and is a component of a system of exterior windows. The "variable optical density" is to provide good visibility through the windows. This system of solar devices can control excess heat transmission providing benefits beyond low-e glass performance while producing electricity.

BACKGROUND OF THE INVENTION

Most solar panels on the market today are positioned from a horizontal orientation at a low angle, so the solar panel face is orthogonal to the sun. The invention described here teaches a unique solar collector array which can be used with an adjacent, concentrator of a complementary design, the objective of which is to increase the level of solar energy harvested while the collector is nominally vertically oriented, and depending on the application, usually maintaining visual transparency of the device.

A primary use of the device is to be employed as a solar collector component of a system of exterior building windows; this requires vertical placement, as windows are usually placed vertically on the building's exterior sides. Since the sun travels in an arc through the sky dependent upon latitude, the shape and configuration of collector elements need to be designed for installation orientation and geographic location. A stationary vertical concentrator system optimized to capture the maximum sunlight from the sun overhead, during all the sunlight hours, is best served by a concentrator consisting of asymmetric, aspheric lenses. The asymmetry is required to optimize the acceptance of sunlight from various latitudes when the concentrator is part of a vertical structure. See U.S. Pat. No. 8,174,776, for details of a suitable concentrator component for such a system.

The configuration, arrangement and complementary design details of a solar collector and an adjacent concentrator optimized to work in synergy is key to maximizing the total solar energy harvested as electricity from the system. The collector and the concentrator are generally designed to have corresponding elements to and work synergistically. Multiple embodiments are presented in the discussion and figures.

In a typical flat panel system, most often the roof or occasionally a side of a building of the building is covered with large solar panels, each of which contains a large number of photovoltaic cells. This results in an expensive system. Furthermore, even with substantial tax subsidies, large roof-mounted PV panels have been challenging to market because they have been perceived by consumers as unsightly and/or inappropriate for most building types.

Technologies used for the generation of solar power include building-integrated photovoltaic (BIPV) solar systems and 'stand-alone' concentrating photovoltaic (PV) systems. The viability of the 'stand-alone' concentrating PV systems has been hindered by the cost and the appearance of the large tracking structures required for their implementation. This excludes them from application to sites that would most benefit from their energy production. That is, the large and unsightly appearance of the structures substantially limits their potential for widespread application to building properties. Furthermore, stand-alone concentrating PV systems suffer from wind loading effects due to their large size.

Buildings are the largest consumers of energy worldwide and among the least efficient. Tall buildings often have small roof areas limiting the useful energy that can be produced by rooftop solutions. Many BIPV systems are relatively expensive and inefficient and have long cost payback periods. According to the United States Department of Energy, building operations account for up to 39% of the country's total energy consumption and 70% of its power plant generated electricity, while 34% of this energy is lost through poor building efficiency. Not surprisingly, the American Solar Energy Society estimates that about 43% of US and 9% of the world's carbon dioxide emissions result from the energy services required to service these buildings. Leveraging PV solar power in the design of energy efficient and self-powered Green Buildings leads to big payoffs in meeting environmental regulations, reducing costs, and enhancing real estate value.

PRIOR ART

Many types of solar concentrators are in use today: such as lenses, mirrors, or reflectors. Examples of such concentrators include dish and trough concentrators. Other solar concentrators comprise an array of optical elements that are individually or collectively adjustable to track the position of the sun in the sky. One predominant type of arrayed concentrator is the "heliostat array". In a heliostat array, a field of reflective or optical elements concentrates solar energy on a collector having dimensions that are small compared to the dimensions of the array. The orientation of the reflective/optical elements in a heliostat array can be individually adjustable by control circuitry, thereby allowing the focal point of the array to remain on the collector over the course of a day and during different seasons. Such an arrangement is often referred to as a "tracking" heliostat array.

In a conventional tracking heliostat array, configuring each optical element to be individually movable typically requires a large amount of expensive motorized equipment and control circuitry. For example, in one conventional configuration, two motors are used to adjust the orientation of each element in the tracking heliostat array. Thus, using this configuration, a tracking heliostat array comprising a 10 by 10 array of mirrors uses 200 motors to adjust the orientation of the mirrors. In addition to causing the array to be undesirably expensive, this large amount of motorized equipment results in an array that is relatively heavy, which is particularly disadvantageous for applications where weight is a significant factor, such as for rooftop mounted applications. These large heavy devices are also complex and require extensive ongoing maintenance, which implies cost, trained personnel, spare parts reserves, downtime, etc., all of which are undesirable for all solar power supplying applications.

The shape of most solar collector elements or cells in use today are generally rectangular, or round. Generally the collector elements occupy the majority of area within a rectangle that would describe or enclose each collector cell. This is a fine design if sunlight hits the solar cell evenly and orthogonally. In many designs with concentrators the sunlight is focused and does not fall evenly across the cells throughout the day, and the year. Having this extra cell material that is not utilized increases the signal to noise ratio for the less lighted portions of the cells, lowering their electrical efficiency.

SUMMARY OF THE INVENTION

This invention provides for the efficient collection of solar energy in a vertical orientation while providing visibility through the device by employing arrays of solar collection elements for use as an integral component of a transparent solar collection panel-window system. These solar collection elements are configured to complement an array of adjacent concentrators. The combination of this transparent solar collection system with an accompanying system of transparent solar concentrators provides the unique combination of high electrical output along with transparency of the device, making it suitable for use in window modules of buildings. Whether utilized in combination with arrays of concentrators or without, the collectors of this invention can be integrated into structural and environmental systems of buildings.

The optical density of the solar collector is specified prior to fabrication of the concentrator arrays and the collector arrays thus allowing the optical density to vary in order to suit the specific application requirements. It is also possible to specify differing degrees of optical density from one area of an array to another, thus providing variable optical density within a single solar collector panel.

The optimal solar concentrator to complement this invention employs aspheric asymmetric lenses, see U.S. Pat. No. 8,174,776, for details of such a solar concentrator. Each lens element of this type concentrator projects a pattern of focused light over a year's cycle, on each collector element, that can be described approximately as a crescent, or a lune. A crescent is a shape produced when a circular disk has a segment of another circle removed from its edge, so that what remains is a shape enclosed by two circular arcs of different diameters which intersect at two points. Since the shape of the focused light projected on the collector cell traces a crescent-like shape over the day and year, the efficiency of the collector is maximized if the collector shape matches the light pattern traced by the concentrator elements. It is also possible to employ other shapes and types of concentrators, however.

Solar collector window modules are usually integrated and distributed within a building envelope, preferably within the exterior of the building envelope. By integrating and distributing the concentrating and collecting system within the building exterior, several advantages may be obtained compared to a stand-alone PV system. Locating and distributing the window modules within a building exterior provides a power generating system with a large area covered by the PV modules, since a building exterior has a large surface area, especially a multistory building. Thus, the power generation system can provide a large power output due to the increased area covered by the PV modules. Integrating the modules within the building envelope, such as inside windows in a building's exterior, protects the modules from the adverse effects of wind loading and weather. Placing the components between windowpanes can provide a pleasing, diffuse light into the building interior. If desired, the modules may also be located on the roof of a building in addition to a building's exterior. These windows along with the collectors and concentrators may be flat or curved depending on building and energy application needs.

In one embodiment of the invention, a building integrated photovoltaic system substantially reduces the "power company" provided energy. Preferably, BIPV features are integrated from the inception of the design process and optimized for geographic location while being addressed by the architectural aspects of the design. In one aspect of the invention, the system design can be included in a range of existing building structures or implemented into new designs. Further, as a system distributed throughout a building, this approach can capitalize on the building structure as support and protection for the system thereby reducing cost. The PV collectors convert the captured energy to direct current (DC) electricity. The DC electrical energy may be transferred to an electrical energy conversion mechanism, which may include DC and/or alternating current (AC) power output. The BIPV windows also block out some of the sun's rays and resulting heat while allowing light to be transmitted to the interior of the building.

This invention provides a transparent solution for efficient, reliable, low maintenance solar energy production within windows, whether vertical or otherwise. The novel crescent shaped solar collector element is optimized for use with asymmetric aspheric concentrator lenses, based on the direction of the installation relative to the sun's path through the sky at the latitude of the installation during the daytime cycle in all seasons. This solar element shape uses the minimum material which also produces the best electrical signal to noise ratio for a solar collector.

BRIEF DESCRIPTION OF THE DRAWINGS

FIG. 3 depicts three differing arrays of crescent shaped solar collector elements: FIG. 3A depicts a dense array, FIG. 3B depicts an array having the collector elements placed in a specific pattern, and FIG. 3C depicts a sparse array.

FIG. 4 depicts a single collector element and a typical complementary solar concentrator. FIG. 4A is an exploded view depicting the shape of the collector cell and the corresponding aspheric asymmetric concentrating lens, while FIG. 4B depicts the relative placement of the solar collector element and the solar concentrating element.

DETAILED DESCRIPTION OF THE INVENTION

Figure 1:
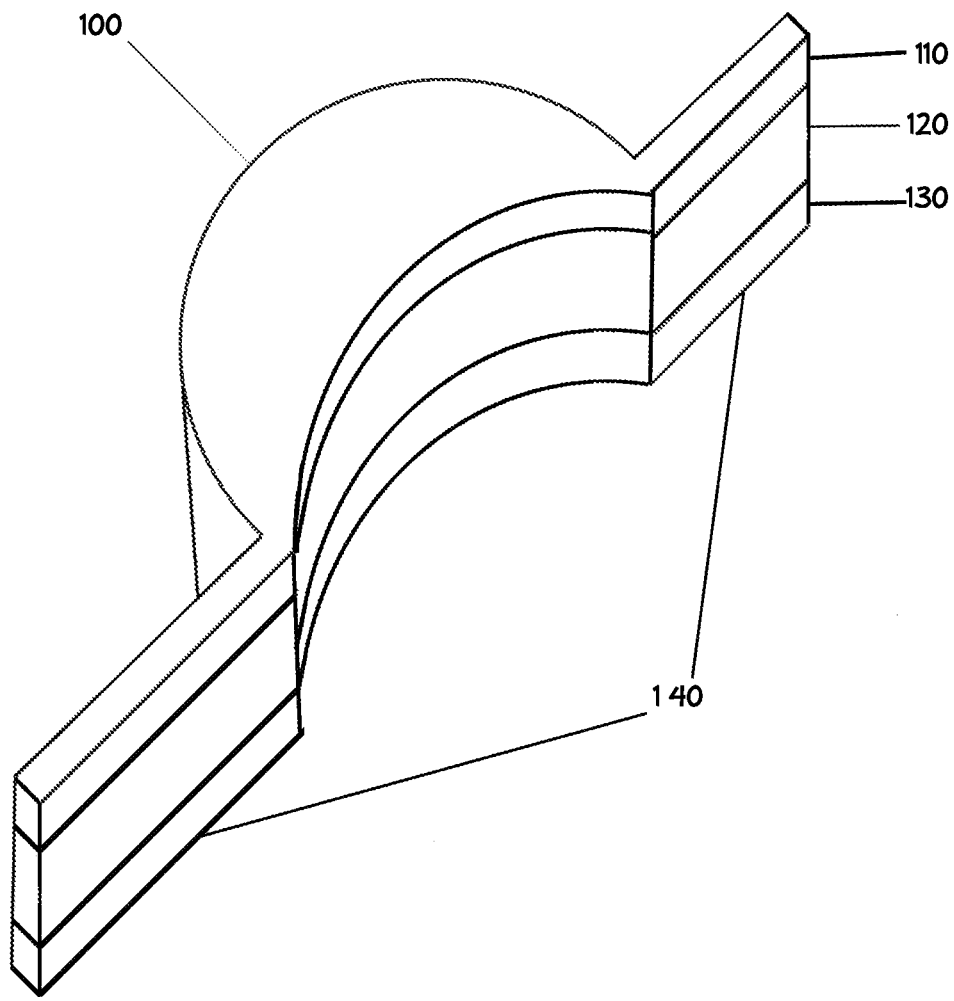
FIG. 1 is a cross-sectional diagram of a single crescent shaped solar collector element with corresponding connectors.

All numbers expressing dimensions, physical characteristics, quantities of ingredients, reaction conditions, and the like used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Moreover, all ranges disclosed herein are to be understood to encompass any and all sub-ranges subsumed therein. For example, a stated range of "1 to 10" should be considered to include any and all sub-ranges between (and inclusive of) the minimum value of 1 and the maximum value of 10; that is, all sub-ranges beginning with a minimum value of 1 or more and ending with a maximum value of 10 or less, e.g., 1.0 to 7.8, 3.0 to 4.5, 6.3 to 10.0.

As used herein, spatial or directional terms, such as "left", "right", "above", "below", "top", "bottom", and the like, are understood to encompass various alternative orientations and, accordingly, such terms are not to be considered as limiting.

As used herein, the terms "on", "applied on/over", "formed on/over", "deposited on/over", "overlay" and "provided on/over" mean formed, deposited, or provided on but not necessarily in contact with the surface. For example, a layer "formed over" a substrate does not preclude the presence of one or more other layers of the same or different composition located between the formed layer and the substrate. For instance, the substrate can include a conventional coating such as those known in the art for coating substrates, such as glass or ceramic.

As used herein, the term "layers" refers to one or more layers. Each layer can be made up of one or more "films".

According to the present invention, the step of depositing a layer can be accomplished using conventional application techniques such as chemical vapor deposition ("CVD"), spray pyrolysis, and magnetron sputtered vacuum deposition ("MSVD") as are well known in the art. Other well-known deposition techniques such as sputtering, plasma enhanced CVD ("PECVD") and plasma assisted CVD ("PACVD") and others may also be utilized in the present invention.

A solar panel as described in this invention is composed of an array of solar collector elements and is optimally employed in conjunction with a complementary array of stationary solar concentrator lenses that are aspheric and asymmetric, such as is disclosed in U.S. Pat. No. 8,174,776. In this optimal embodiment, the collector elements are arranged to correspond one-to-one with the concentrator lens elements. The optimum shape for the collector elements in the array is the shape of the area described by the movement of the focal point from the lens in the complementary collector array over the course of a year. This is a crescent-like shape as shown by single collector element 100 in FIG. 1. The alignment between concentrator elements and collector elements is critical for optimum performance of the collectors. FIG. 4 depicts the relationship between a single collector element and the corresponding concentrator element. Placement, size, and shape of the solar collector elements are determined by the size and placement of the corresponding concentrating lenses in the concentrator array.

The length of each solar collector element is determined by the travel length of the focal spot from the sun traced on the collector panel through a corresponding adjacent concentrator element at the summer solstice for the latitude of installation.

The width (y axis in Cartesian coordinates) of each solar collector element is determined by the focal spot from the sun on the collector panel through a corresponding adjacent concentrator element traced throughout the year at the latitude of installation.

Other embodiments of this invention may have collector elements in other shapes such as round, elliptical, rectangular, etc. In the case when the collector array is not used in conjunction with an array of concentrating lenses, the placement, size and shape of the solar collector elements is determined by the requirement of the intended installation site. Custom arrays of collector elements may be configured in geometric patterns, logos or symbol configurations. FIG. 3A shows a dense array of crescent shaped collector elements and FIG. 3B shows an array of crescent shaped elements that are arranged in a custom pattern and FIG. 3C shows a sparse array of crescent shaped elements.

The solar collectors are employed as elements in a variably transparent solar collector array in order to collect solar energy over a large area, in which the collector elements may be organized in various configurations. The collector elements are intended for use in an array where the collector elements and their corresponding concentrating lenses are spaced in the array to allow the transmission of light between the individual array elements, thus giving the characteristic of transparency to the array, the degree of transparency being dependent upon the size of the individual collector elements in the array and the density of placement of the collector elements in the array. The number of solar collector elements, the configuration, size, and orientation of the collector elements, and their density in the solar collector array, may be varied from one area of the panel to another, thus providing varied light transmission and transparency.

The collector material is a thin film photovoltaic material that may be comprised of polysilicon, CIGS (copper indium gallium selenium), CdTe (cadmium telluride), etc., on a transparent or semitransparent substrate.

The solar collector panel may have surface texturing, coatings, or other materials applied or other treatments selected to improve device efficiency or the optical transmission characteristics of the device, or to reflect solar radiation back to the solar collector.

The solar collector panel may have a curvature or topology that is configured to maximize solar energy collected based on the direction of the installation relative to the sun's path through the sky at the latitude of the installation during the daytime cycle over the course of the year. Curvature or topology of the panel may also depend upon the requirements of the intended placement of the panel whether on a building or other shaped surface.

Solar collection panels maybe used standalone or combined with lenses, simple reflectors, Bragg photonic reflectors, rotating mounting assemblies to track the sun through the sky, or other devices to gather additional sunlight during operations.

While a specific embodiment is described herein, it will be recognized that the present invention is not limited to the specific embodiment described. For example, different or new fabrication techniques and materials may be used or other changes made that do not depart from the spirit and scope of the present invention. The invention is intended to be limited only by the attached claims.

Figure 2:
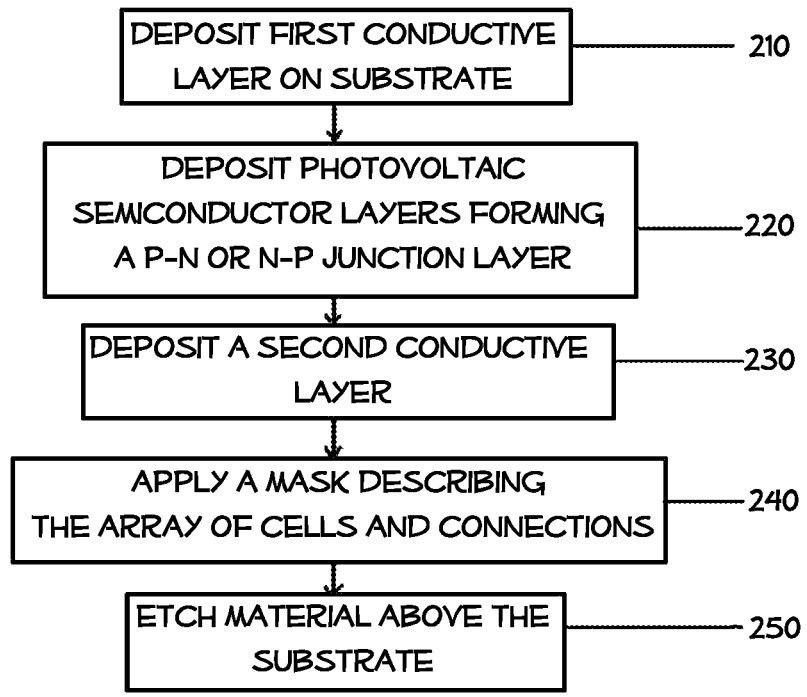
FIG. 2 is a flow diagram of the method for fabricating a transparent solar collector or array of collectors.

FIG. 2 is a flow diagram showing the method for fabricating a transparent solar collector or array of collectors according to the present invention. While FIG. 2 shows a specific embodiment, it is not intended that this be the only way such a solar collector may be fabricated.

The specific embodiment employs a Float Glass thin film polysilicon process, see U.S. Pat. No. 8,168,467, which can also be combined into other high heat glass manufacture processes. When the term glass is used throughout this invention description, it is intended to be inclusive of most glass types and varieties. One of skill in the art will recognize that other variations of the invention are readily apparent from the specific embodiment described herein. If soda glass is chosen for the substrate, then a barrier layer is applied to avoid the sodium migrating from the glass poisoning the adjacent semiconductor layer. Barrier layers are commonly used in fabrication today.

Referring to flow diagram FIG. 2, a suitable transparent substrate is provided upon which a transparent or semitransparent solar collector may be fabricated. In one embodiment the substrate is Float Glass, or other material suitable for a high heat continuous forming process. Significantly, glass during a Float Glass based manufacturing process allows the additional heat required to melt silicon to be applied without damaging the glass substrate surface due to the molten or plastic state of the glass. Lower heat processes on glass or other transparent substrates may be employed when the collector element is comprised of other thin-film materials such as CIGS (copper indium gallium selenium) or CdTe (cadmium telluride) or other without departing from the present invention. Depending upon the embodiment, the substrate may also be coated with a variety of materials.

In FIG. 2 step 210, a first conductive layer is formed on the substrate. In the specific embodiment, the conductive layer is nickel (Ni) deposited over the entire substrate. Materials for the conductive layer may include: Graphene, molybdenum, copper, chromium, tungsten, silver or others. The thickness of the first conductive layer will vary for different applications and materials and is a function of the required amount of conductivity. Depending on the method of deposition, and the conductive material, an annealing step may be required. The first conductive layer may be a single layer or multiple layers, depending upon the embodiment. Some embodiments may include overlaying the first conductive layer with a reflective system such as a solar Bragg grating consisting of an optical grating covered by a photonic crystal layer.

In FIG. 2 step 220, the conductive layer(s), and all other layers that may be present, are coated with a thin-film photovoltaic material. One embodiment of FIG. 2 step 220 is comprised of: a) a first doped silicon layer formed by chemical vapor deposition (CVD) or other deposition method overlying the region of interest; b) a second doped silicon layer formed by chemical vapor deposition (CVD) or other deposition method overlying the region of interest; c) annealing of the doped silicon layers using rapid thermal annealing using xenon flash lamps, $CO_2$ laser, or other adequate heat source. This results in a polycrystalline structure creating a P-N or N-P junction.

In the specific embodiment, the first doped silicon layer is a p-type material. It is doped by pre-mixing silicon with boron or other p-type dopant prior to forming the layer. The concentration of boron or other p-type dopant is such that is commonly used for producing solar cells. This first silicon layer preferably has a thickness of about 1 to 50 microns in the specific embodiment.

In the specific embodiment, the second silicon layer is an n-type material. It is doped by pre-mixing silicon with an n-type dopant material such as phosphorus or other n-type dopant prior to forming the layer. The concentration of phosphorus or other n-type dopant is such that is commonly used for producing solar cells. The second silicon layer preferably has a thickness of about 1 to 50 microns in the specific embodiment.

Other embodiments may include germanium silicon, or gallium nitride, or gallium arsenide, which may be used to form a multilayer sandwich structure. Thin film materials such as CIGS or CdTe or other materials may be deposited by various methods creating the P-N or N-P junction of FIG. 2 step 220.

In FIG. 2 step 230, a transparent conductive layer is formed above the P-N junction created in FIG. 2 step 220 resulting in a solar collector. In the specific embodiment the conductive layer in FIG. 2 step 230 is made of indium tin oxide or tin oxide, or other suitable transparent conductive material.

In FIG. 2 step 240, a mask describing the intended elements of the array of solar collectors and the electrical connections between the elements is applied over the materials deposited on the substrate in FIG. 2 steps 210 through 230. The specific size, shape, and placement of the cells, or solar collector elements, are dependent upon the intended application.

In an embodiment where the array of solar collector cells is intended for use in conjunction with a complementary array of concentrator lenses used to increase the efficiency of the system, the specification of the mask of FIG. 2 step 240 used to describe the solar collectors and the connections between the cells is derived from the specification for the fabrication of the complementary array of lenses. In this embodiment the etching process in FIG. 2 step 230 produces crescent shaped optical collectors, 100 of FIG. 1, that are located near the focal point of individual concentrator lenses. The size and shape of the collectors vary depending on the optical characteristics of the particular concentrator embodiment.

FIG. 4 depicts a single solar concentrator and the corresponding single solar collector element. FIG. 4A depicts an exploded view of the aspheric asymmetric lens 400 positioned above the single corresponding solar collector 410, which rests on the substrate 420. FIG. 4B depicts the relative placement of the aspheric asymmetric lens 400 in contact with the solar collector consisting of the top conductive layer 450, the P-N solar collector 470 and the bottom conductive layer 460 residing on the substrate 420. This view also depicts the sun's rays concentrated into a single focal point, via the aspheric asymmetric lens 400, on or near the top surface of the semiconductor P-N layer 470 at the point of contact 440.

Another embodiment of this invention is implemented without a complementary concentrator array. In this embodiment, the specification for the mask is based upon the requirements for the transparency of the device and or other visual aspects of the implementation. In such embodiments the thin film polysilicon or other thin film solar collector may be etched in FIG. 2 step 250 into an array of solar collectors, introducing space between the cells thus making the device transparent or semi-transparent depending on the application needs. The level of transparency depends on the size of the cells and the spaces between the cells. The panels can be optimized for efficient optical transmission, depending upon the requirements of the installation site. Solar collectors may be employed as elements in a variably transparent solar collector array to collect solar energy over a large area in which the collector elements may be organized in various configurations. In the array of solar collectors the number of solar collector elements, configuration and orientation of the collector elements, and their density in the solar collector array, may be varied from one area of the array to another, thus providing varied light transmission and transparency.

In FIG. 2 step 250 the unmasked portions of all layers deposited on the substrate are etched away by means of photolithography, laser ablation, or other method to expose solar collector elements and the connections and contacts connecting the elements, thus describing an array of solar collector elements and the contact connections between them, forming a complete electrical circuit. The mask is subsequently removed.

FIG. 1 is a cross-sectional diagram of an embodiment of a single collector element 100 and the cell's connectors following the etching of FIG. 2 step 250. A first conductive layer 130 overlies a transparent substrate. A P-N or N-P junction 120 overlies first conductive layer 130. A second conductive layer 110 overlies P-N or N-P junction 120. Cell connectors 140 provide the pathway for the flow of electrons between cells.

After the thin film material is etched or patterned, an optional transparent insulating material comprised of plastic, polycarbonate or acrylic may be deposited over the entire area, filling the voids between collector elements and providing a thin transparent protective layer over the structure.

The foregoing description of the invention has been presented for purposes of illustration and description. It is not intended to be exhaustive or to limit the invention to the precise form disclosed, and modifications and variations are possible in light of the above teachings or may be acquired from practice of the invention.

The drawings and description were chosen in order to explain the principles of the embodiments of the invention and its practical application. It is intended that the claims and terms thereof be interpreted to protect the invention to the broadest extent permitted by the prior art and the applicable law.

What is claimed is:

1. A device for the collection of solar energy; a solar energy collector array of collector elements employed in a variably transparent solar collector panel allowing visibility through the panel, to be utilized in a predominantly vertical orientation comprising:
   a) said solar collector elements formed on a substrate, designed and configured to maximize solar energy collected from concentrated sunlight via a complementary adjacent solar concentrator, whose concentrating elements correspond in size and location to the collector elements;
   b) the number, configuration, orientation of the collector elements, and their density in the solar collector array, can optionally be varied from one area of the array to another providing varied light transmission and transparency depending upon the requirements of the application;
   c) said collector element shape being based on the direction of the installation relative to the sun's path through the sky, at the latitude of the installation, during the daytime cycle in all seasons, comprising:
   i.) said solar collector elements has a first side surface and a second side surface, wherein the first side surface is closest to the substrate and the second side surface is farthest from the substrate and opposite the first side surface, both said first side surface and said second side surface are flat, each of whose shape is approximately a crescent;
   ii.) the length of each solar collector element is determined by the travel length of the focal spot from the sun traced on the collector panel through a corresponding adjacent concentrator element at the summer solstice for the latitude of installation;
   iii.) the width of each solar collector element is determined by the focal spot from the sun on the collector panel through a corresponding adjacent concentrator element, the width of each collector element being determined by the focal spot traced throughout the year at the latitude of installation.

2. The solar collector of claim 1, wherein the collector element material is comprised of polysilicon, germanium silicon, gallium nitride, or gallium arsenide, and can optionally be formed in a multilayer sandwich structure.

3. The solar collector panel in claim 1, wherein surface texturing, coatings, or other materials are applied or other treatments selected to improve device efficiency or the optical transmission characteristics of the device, or to reflect solar radiation back to the solar collector.

4. A method of fabrication for variably transparent solar collection arrays of claim 1, comprising forming said collector elements in approximately a crescent shape.

* * * * *